(12) United States Patent
Gidon et al.

(10) Patent No.: US 6,581,279 B1
(45) Date of Patent: Jun. 24, 2003

(54) METHOD OF COLLECTIVELY PACKAGING ELECTRONIC COMPONENTS

(75) Inventors: Pierre Gidon, Enchirolles (FR); Paul Philippe, La Cote Saint Andre (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/763,203

(22) PCT Filed: Aug. 24, 1999

(86) PCT No.: PCT/FR99/02034

§ 371 (c)(1),
(2), (4) Date: Apr. 4, 2001

(87) PCT Pub. No.: WO00/11714

PCT Pub. Date: Mar. 2, 2000

(30) Foreign Application Priority Data

Aug. 25, 1998 (FR) ............................................. 98 10685

(51) Int. Cl.⁷ ................................................. H05K 3/36
(52) U.S. Cl. .............................. 29/830; 29/827; 29/840; 29/829; 174/250; 174/255; 174/262; 361/748; 361/749; 361/760; 257/678; 257/723
(58) Field of Search .......................... 29/829, 830, 827, 29/831, 832, 834–837, 840, 852; 257/686, 680, 678, 723; 174/52.2, 52.4, 252, 262, 250, 255; 361/714, 768, 782, 748

(56) References Cited

U.S. PATENT DOCUMENTS

| | | | | |
|---|---|---|---|---|
| 5,073,814 A | * | 12/1991 | Cole, Jr. et al. | ............... 357/54 |
| 5,353,498 A | * | 10/1994 | Fillion et al. | .................. 29/840 |
| 5,401,913 A | * | 3/1995 | Gerber et al. | ............... 174/264 |
| 5,524,339 A | * | 6/1996 | Gorowitz et al. | ............. 29/841 |
| 5,585,669 A | * | 12/1996 | Venambre | ................... 257/679 |
| 5,614,277 A | * | 3/1997 | Beilstein, Jr. et al. | ..... 428/40.1 |
| 5,811,879 A | * | 9/1998 | Akram | ........................ 257/723 |
| 6,134,776 A | * | 10/2000 | Hoffmeyer | .................... 29/840 |
| 2001/0015488 A1 | * | 8/2001 | Akram et al. | ............... 257/686 |

FOREIGN PATENT DOCUMENTS

| | | | | |
|---|---|---|---|---|
| GB | 1136840 | | 12/1968 | |
| GB | 1467354 | | 3/1997 | |
| JP | 02312296 A | * | 12/1990 | .................. 29/837 |
| JP | 03064956 A | * | 3/1991 | .................. 257/724 |
| JP | 03280495 A | * | 12/1991 | .................. 29/740 |
| WO | WO9519645 | | 7/1995 | |

OTHER PUBLICATIONS

Armonk, "Direct Attachment of a Silicon Carrier for IC Chips to a Circuit Card" *IBM Technical disclosure Bulletin*, vol. 32, Sep. 1989. Pp. 93–95.
Cognetti, et al., "Packaging", Chapter 13, 24 pages.

* cited by examiner

*Primary Examiner*—Peter Vo
*Assistant Examiner*—Minh Trinh
(74) *Attorney, Agent, or Firm*—Thelen Reid & Preist LLP

(57) ABSTRACT

Method of collectively packaging a plurality of electronic components formed in a first substrate, wherein the electronic components are separated from one other by separation strips associated with a plurality of conducting tracks formed on a second substrate. The conducting tracks on the second substrate are associated with contact pads of the components in the first substrate. Each conducting track on the second substrate includes a connection strip arranged to coincide with associated depressions in the first substrate when the first and second substrates are mated. After mating, the components are separated into individualized electronic modules by forming proximal trenches in the first substrate and distal trenches in the second substrate. The proximal trenches are formed around the components in the first substrate to open up into the depressions in the first substrate. The distal trenches are formed further away from the components than the proximal trenches in regions comprising the connection strips on the second substrate.

13 Claims, 3 Drawing Sheets

METHOD OF COLLECTIVELY PACKAGING ELECTRONIC COMPONENTS

This application is a national phase of PCT/FR99/02034 which was filed on Aug. 24, 1999, and was not published in English.

TECHNICAL FIELD

The invention relates to a process for collective packaging of a plurality of components initially formed in a same substrate. In particular, packaging may include individualization of parts of the substrate, called modules, each comprising at least one component. Packaging may also include making electrical contacts on the component(s), making thermal contacts for the dissipation of heat produced by the component(s), and packaging of components.

Furthermore, an electronic component is an individual component, and particularly an active component such as a transistor or an assembly formed of a plurality of components such as an amplification stage.

The invention is used in applications in many electronics fields and particularly for the packaging of electronic power components, that requires thermal contact between components or the substrate and dissipation heat sinks.

STATE OF PRIOR ART

A number of techniques are known for transferring a first substrate comprising a number of components onto a second substrate, essentially acting as a connection intermediary between connection pads and input/output terminals of components on the first substrate.

In particular, a "flip-chip" technique consisting of hybridisation by meltable material is known. According to this technique, connection strips of the substrates to be hybridised placed facing each other are electrically and mechanically connected through bushings made of meltable material welded collectively onto the connection strips.

The hybridisation technique using meltable material may be used particularly to add a plurality of electronic chips each comprising one or several components, onto a large support substrate. However in this type of application, all chips have to be positioned individually on the support substrate before starting the heat treatment to melt the meltable material in the bushings for collective soldering.

Individual positioning of the chips is an expensive step that can prevent industrial manufacturing of assemblies from being cost effective.

The hybridisation technique using meltable material can also be used for the interconnection of a plurality of stacked substrates connected electrically by bushings formed on their main faces opposite each other.

Contacts and connections to the outside of this type of stack are formed on the main free outside faces. The existence of large number of input/output terminals on the main free faces forms a handicap to installation of heat sinks designed for power components.

The document "Smart Power ICS Technologies and Applications"—B. Murani, F. Bertotti, G. A. Vignola—Spinger Chap. 13 contains an illustration of the state of the art described above.

PRESENTATION OF THE INVENTION

The purpose of the invention is to propose a process for packaging and particularly for making electrical contacts for components formed on a substrate without the limitations of the techniques described above.

One purpose in particular is to propose a process for collectively processing a large number of components initially formed on a same substrate, and consequently adapted to industrial use.

Another purpose is to propose a process for reconciling requirements to make electrical contacts on a large number of input/output terminals and efficient thermal contact for dissipation of heat from power components.

More precisely, in order to achieve these purposes, the objective of the invention is a process for collective packaging of a plurality of components formed in a first substrate board and separated from each other by separation strips, each component comprising at least one contact pad flush with a first surface of the said first board. The process according to the invention comprises the following steps in sequence:

a) formation of a depression in at least one separation strip contiguous to the said component, in the first board, for each component, b) formation of conducting tracks on a second substrate board, each track being associated with the contact pads of components on the first board, each of the conducting tracks associated with the contact pads of a component on the first board extending onto a "connection" strip, the connection strip being arranged to coincide with the depression contiguous with the said component on the first substrate board, when the first and second substrate boards are assembled, c) assembly of the first and second substrate boards so as to bring the contact pads of the components of the first board into electrical contact with the corresponding tracks on the second board, and to make each connection strip on the second board coincide with a corresponding depression on the first board, d) cutting out the first board by the formation of "proximal" trenches around the components, the proximal trenches opening up into the said depressions in the separation strips, and cutting out the second board around the components by the formation of "distal" trenches, further away from the components than the proximal trenches in regions comprising connection strips, in order to allow the connection strips on the second board to project at least partially beyond at least one edge of the first board, the first and second cut outs being used to individualise the modules each formed of a portion of the first board comprising at least one component and one portion of the second board.

With the process according to the invention, the board interconnection and assembly operation is collective until the modules are cut out. Consequently, it is suitable for inexpensive industrial implementation.

Furthermore, since the connection strip of the second substrate board projects laterally beyond the first board, it is possible to make electrical connections on this strip without taking up space on the main faces of the substrate boards. These faces can then be used for other contact terminals, if any, or be fitted with heat sinks to dissipate heat produced by power components integrated in the substrate boards, if any.

For example, the substrate boards can be cut out in step d) by sawing. They can also be cut using a water jet and/or by laser. Etching techniques may also be used using reactive ions, particularly in combination with other cutting techniques. Etching may be used to increase the precision and finish quality of the cut.

The first and second boards may be cut at the same time by using a saw with offset blades or a step-shaped saw blade.

During step a) of the process, the electrical connection between contact pads on the first substrate board and conducting tracks on the second substrate board may for example be made using bushings of meltable material using the "flip-chip" technique, or by means of a conducting glue. The conducting glue may be anisotropic so that it conducts current vertically between boards without conducting current laterally between different contact pads.

In the second case, it is advantageous to form depressions to make reservoirs to collect any excess glue during assembly, in the second substrate board before assembly takes place.

If the electrical connections are made by bushings of meltable material, the process may also comprise placement of a dielectric filling material between the first and second substrate boards, the said dielectric material surrounding the bushings made of a meltable material.

Advantageously, in this case it is also possible to form a portion of the tracks intended to receive the bushings of meltable material in a depression in the second board. The depression will then hold the dielectric filling material during assembly.

Furthermore, the depression in the second board can be formed with an upstand arranged outside the areas of the depression in the first board, such that a bottleneck is formed by the upstands of the depressions in the first and second boards. The bottleneck prevents the filling material from spreading out onto the connection strips during assembly of the substrate boards.

Furthermore, at least one component connected to at least one of the conducting tracks can be formed in the second substrate board, and associated with a contact pad on the first board.

The invention also relates to an electronic module comprising:
- a first substrate board with at least one electronic component and contact pads connected to the component,
- a second substrate board assembled to the first board, the second board comprising conducting tracks electrically connected to the contact pads and extending over a connection strip on the second board that projects beyond the edge of the first board.

This type of module can be made according to the process described above.

When the electronic components are power components, the module may also comprise at least one heat sink fixed to at least one free face of the first and second boards.

The invention also relates to an electronic device comprising a package, contact pins formed in the package and an electronic module like that described above inserted in the package. Conducting tracks of the connection strip are connected by wire to the corresponding contact pins.

Other characteristics and advantages of this invention will become clear after reading the following description with reference to the figures in the attached drawings. This description is given for illustrative purposes only and is in no way limitative.

DETAILED DESCRIPTION OF EMBODIMENTS OF THE INVENTION

In the following description, references to identical, similar or equivalent parts in the figures are assigned the same numeric references.

Figure 1:
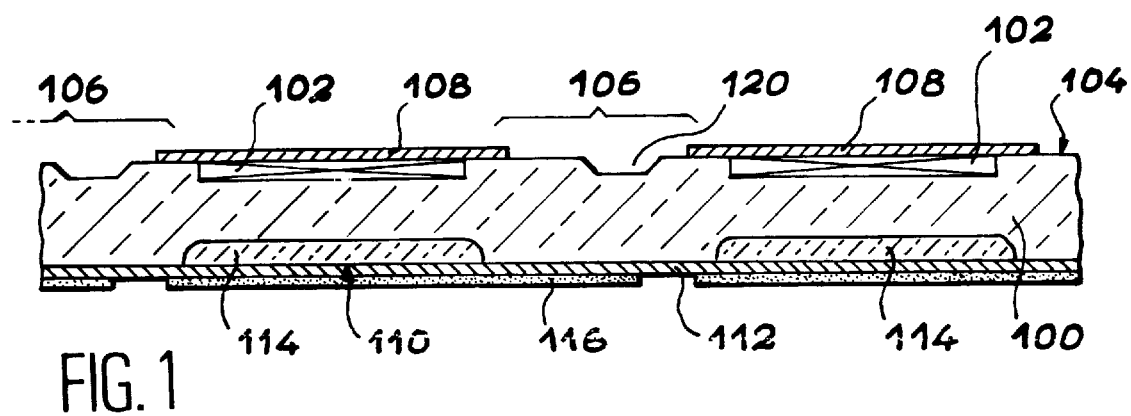
FIG. 1 is a simplified diagrammatic section through a first substrate board comprising a plurality of electronic components, illustrating a preparatory step in the process according to the invention.

Reference 100 in FIG. 1 indicates a first substrate board, for example a silicon wafer in which a plurality of components 102 are formed. Only two components are shown in the figure for reason of clarity. Components 102 may all be identical to each other if the process is used industrially. In the example shown in the figure, they are formed on a face 104 of the substrate called the "front face".

The components are separated from each other by strips 106 called separation strips.

Metallic contact pads 108 are formed on the front face 104 above the components and are electrically connected to input/output terminals or component power supply terminals.

For simplification reasons, only one contact pad 108 is shown in the figure. However, a plurality of such pads can be provided on components, adjacent to each other on the front face 104.

One face 110 of the substrate called the "back face", opposite to the front face 104, is provided with a metal layer 112 such as a layer or stack of metal such as aluminium, copper or tungsten, this layer also forming one or several connection pads. The substrate 100 may comprise doped regions 114 associated with the components 102 in electrical contact with the metal layer 112 close to its back face 110.

The metal layer 112 is also insulated locally by a layer 116 called the passivation layer, for example formed from silica or polymers.

FIG. 1 shows that depressions 120 are formed in separation strips 106. These depressions, which for example may be made by etching or partial sawing of the substrate, are in the form of grooves that completely or partially surround the periphery of the components.

For example, the depth of the depressions 120 may be of the order of 10 $\mu$m for a substrate board 100 approximately 300 $\mu$m thick.

Figure 2:
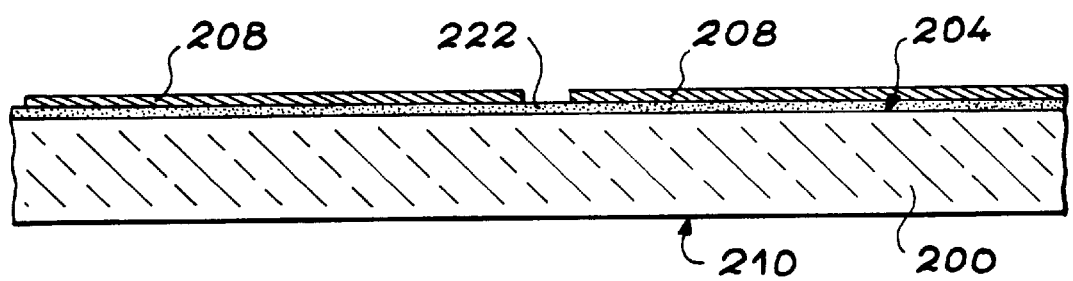
FIG. 2 is a simplified diagrammatic section through a second substrate board that will be assembled with the first board.

FIG. 2 shows preparation of a second substrate board 200 with a front face 204 and a back face 210.

The material from which the second substrate board is made is preferably chosen to have good thermal conductivity and good mechanical strength. Similarly, its thickness is chosen to make a compromise between the requirements of good transmission of heat (thin) and sufficient stiffness (thicker).

For example, the second substrate board may be a 300 μm thick silicon wafer.

The front face 204 of the second substrate board 200 is covered by an electrical insulating layer 222, for example made of silicon oxide, on which conducting tracks 208 are formed. The thickness of the insulating layer 222, usually of the order of a few micrometers, may be adapted to a required voltage withstand between the conducting tracks 208 and the substrate 200. When the second substrate board is made of an electrically insulating material, the insulating layer 222 may be omitted.

For example, the aluminium and/or copper or alloy conducting tracks 208 extend over the second substrate according to a pattern corresponding to the pattern of the contact pads 108 of the first substrate board so that they coincide with these pads locally when the first and second substrates are assembled. The tracks 208 may also be connected to contact pads formed on the second substrate board and coincident with the pads on the first board.

Figure 3:
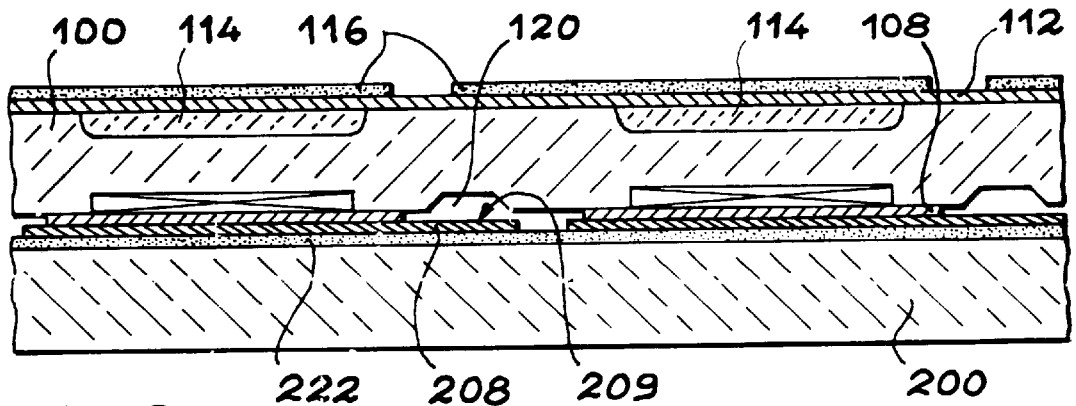
FIG. 3 is a schematic section through the first and second assembled substrate boards.

FIG. 3 shows a structure obtained by assembling the first and second boards 100, 200 by their front faces 104, 204 respectively.

The contact pads 108 are now in electrical and mechanical contact with the conducting tracks 208. For example, the contact may be formed by welding, gluing, application of pressure or use of the "flip-chip" technique mentioned above. This aspect will be described in more detail with reference to FIG. 5.

FIG. 3 shows that the conducting tracks 208 on the second substrate board are sized and laid out so that they extend facing the depression 120 on the first board, contiguous with the component connected to these tracks, respectively. The end part of the tracks that extends facing the depression 120 is called the connection strip and is marked as reference 209 on the figure.

Figure 4:
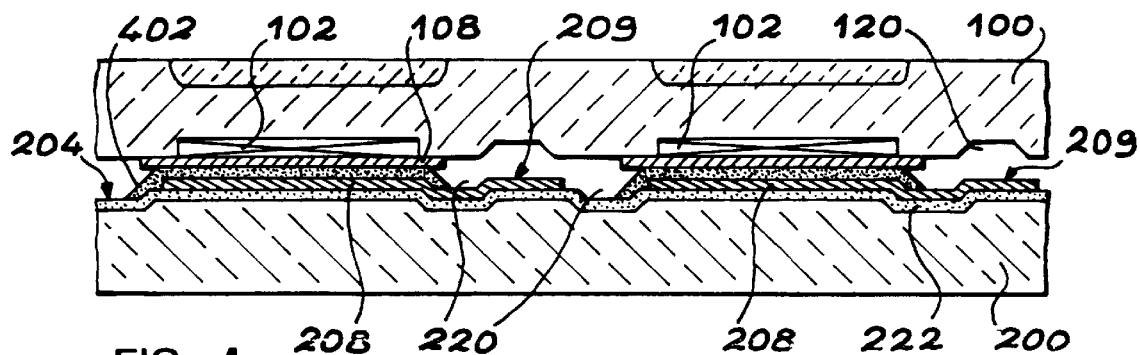
FIGS. 4 and 5 are simplified diagrammatic sections through an assembly similar to that in FIG. 3 illustrating different possibilities for making electrical connections between substrate boards.

FIG. 4 described below shows one particular means of connecting the metallic contact pads 108 on the first substrate board 100 with the conducting tracks 208 on the second substrate board 200. In the example in FIG. 4, the electrical contact is created through a layer 402 of conducting glue placed between each contact pad 108 and the corresponding conducting track 208 associated with it.

FIG. 4 also shows that depressions 220 may be formed in the front face 204 of the second substrate board at locations preferably facing the ends of the contact pads 108 on the first substrate board. The depressions 220 act as a reservoir to collect any excess conducting glue to prevent this glue from spreading over the connection board or short-circuiting several tracks.

Figure 5:
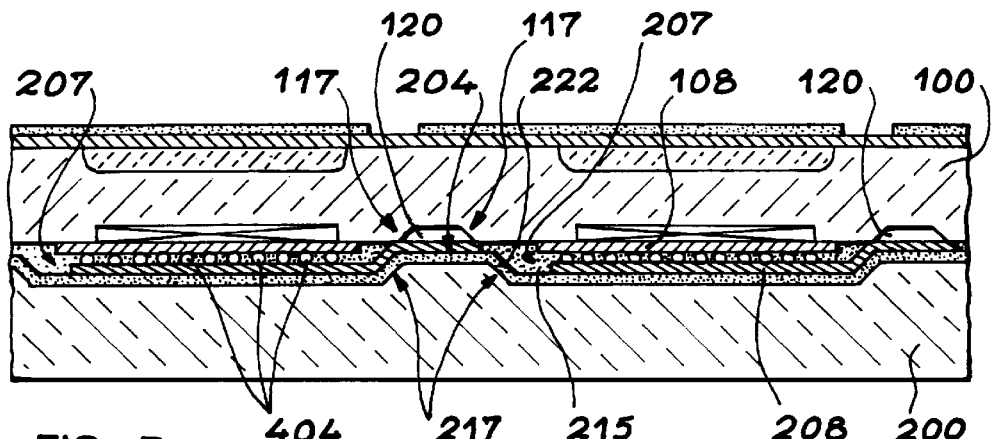

According to one variant illustrated in FIG. 5, the connection between the contact pads 108 on the first substrate board 100 and the conducting tracks 208 on the second substrate board 200 is made by balls 404 made of a meltable material using the flip-chip technique known in itself.

The part of the conducting tracks 208 that contain the balls made of a meltable material, is formed in depressions 207 formed in the front face of the second substrate board 200. The depressions 207 are preferably filled in with a dielectric material 215 such as a polymer that solidifies and spreads out between the balls 404.

An upstand 217 around each depression 207 on the second substrate board 200 forms a bottleneck outside the corresponding depression areas 120 on the first substrate board.

This bottleneck prevents the dielectric material 215 from spreading over the connection strip 209.

Figure 6:
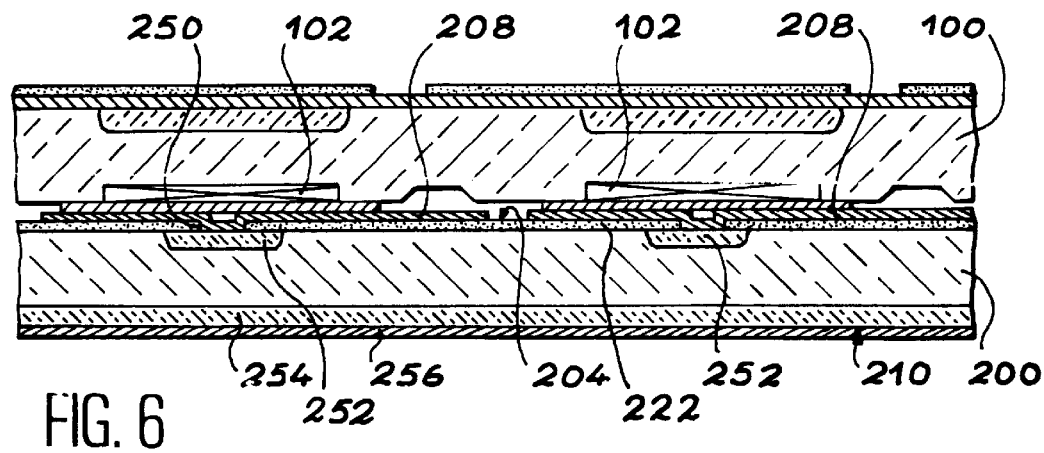
FIG. 6 is a simplified diagrammatic section through an assembly similar to that in FIG. 3 and illustrating the manufacture of components in the second substrate board.

FIG. 6 described below illustrates a particular embodiment of the second substrate 200 of an assembly of substrate boards conform with FIG. 3.

Openings 250, formed in the insulating layer 222 covering the front face 204 of the second substrate board 200 put the conducting tracks 208 into electrical contact with the doped regions 252 formed close to the front face of the second substrate board.

Another doped region 254 is formed close to the back face of the second substrate board in contact with a metal layer 256 formed on the said back face.

The doped regions 252, 254 of the second substrate board 200 are used to form components, and particularly diodes.

Diodes are addressed by one of the conducting tracks 208 and by the metal layer 256 on the back face. For example, they may be connected in parallel with the components 102 formed in the first substrate board 100 in order to protect them from overvoltages.

All operations carried out until a structure conform with FIGS. 3, 4, 5 and 6 is obtained, and particularly until the connection (hybridisation) is made between contact pads on the first substrate board and the conducting tracks on the second board, are collective operations for all components.

Substrate boards are then cut to individualize the components. Cutting is done in two steps, according to the process described with reference to the figures.

Figure 7:
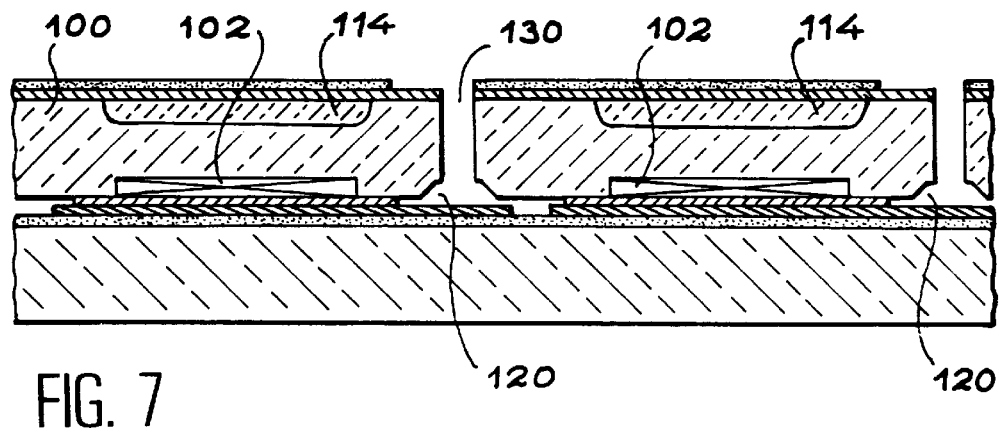
FIG. 7 is a diagrammatic section through the assembly in FIG. 3 and illustrates a first cutting step.

A first cutting step is illustrated in FIG. 7. This step consists of cutting the first substrate board 100 by sawing.

Sawing forms trenches 130 in the first board surrounding the components 102, in particular leading into depressions 120 formed around the components. Cutting may also be done using other techniques, for example such as etching techniques.

Figure 8:
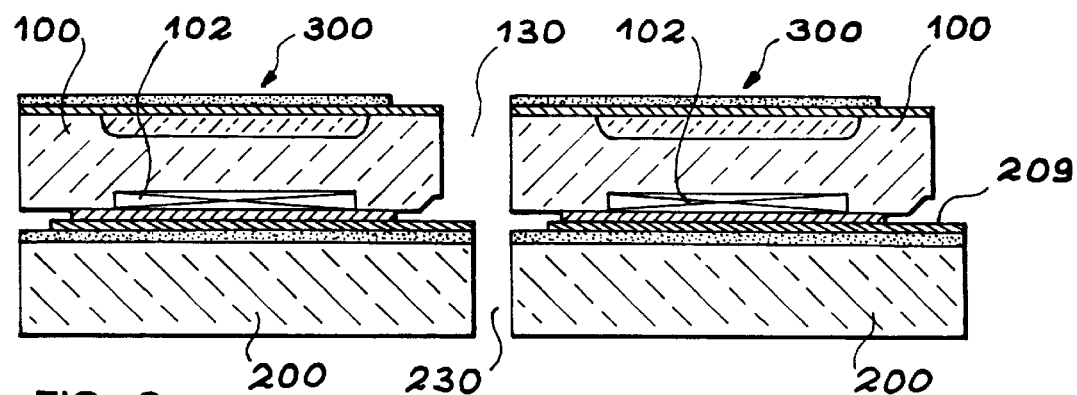
FIG. 8 is a diagrammatic section through the assembly in FIG. 4 and illustrates the second cutting step to individualize modules each comprising at least one component.

A second cutting step is illustrated in FIG. 8.

This step includes cutting the second substrate board 200 and individualizes the modules 300. Each module 300 comprises a portion of the first substrate board 100 and a portion of the second substrate board 200, and contains at least one component.

FIG. 8 shows that the cutting trenches 230 formed in the second substrate board 200 are further away from the components in the regions of the connection strips 209 than the trenches 130 formed by the cut in the first substrate board 100. The cut in the second substrate board thus makes room for at least part of the connection strip 209 of each module to project. The connection strip thus projects over at least one upstand of the module, in other words on a side of the trench in the first substrate board.

The cut on the second substrate board can extend into the first substrate board to widen the cutting trenches in this first board. Furthermore, the cuts in the first and second substrate boards may be done simultaneously. For example, the offset of the trenches necessary to allow the connection strip 209 to project can then be obtained by using a step-shaped saw blade. Advantageously, all or some of the modules derived from the same substrate boards may be cut simultaneously with a multiple blade saw.

Figure 9:
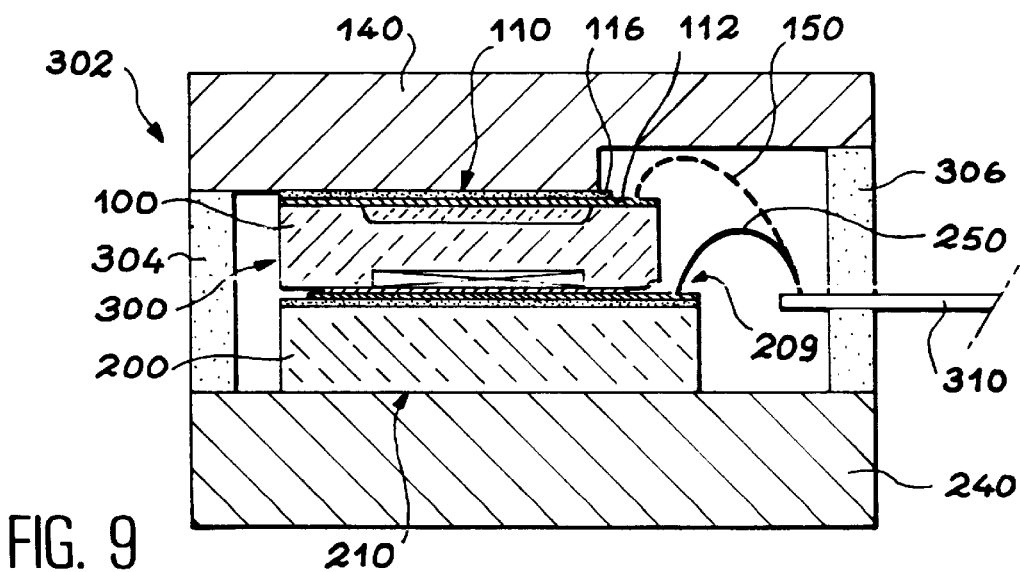
FIG. 9 is a simplified diagrammatic section through one of the modules and illustrates its use with heat sinks and connection pins.

The advantage of having a connection strip 209 projecting laterally on the upstand of modules 300 is illustrated in FIG. 9 that shows one possible way of packaging a module.

The package shown with the general reference 302 contains a module 300 and has two main faces formed by heat sinks 140, 240.

A first heat sink 140 forms an "upper" face of the package 302 and is put into thermal contact with the passivation layer 116 that covers the back face 110 of the first substrate board 100 of module 300.

A second heat sink 240 forms a "lower" face of the package 302 and is put into thermal contact with the back face 210 of the second substrate board 200 of module 300.

Electrically insulating side walls 304, 306 connect the heat sinks to hermetically close the package.

Connections 250 are made by metallic wire between the end of the conducting tracks 208 extending into the connection strip 209 of the second substrate, and contact pins 310 passing through a side wall 306 of the package 302.

Since the connections are made by lateral connection strips 209, the back faces 110, 210 of the second substrate board, and also of the first substrate board in the module, comprise very few or no electrical contacts. This characteristic encourages direct assembly of each of these faces on a heat sink as described above. This can improve dissipation of heat produced by the components 102.

The metallic layer 112 forming the back contacts of the first substrate board 100 may also be connected to a contact pin (not shown) by a wire 150.

What is claimed is:

1. A method of collectively packaging a plurality of components (102) formed in a first substrate board (100) and separated from each other by separation strips (106), each component (102) comprising at least one contact pad (108) flush with a first surface (104) of the first board (100), the method comprising the steps of:

a) forming a depression (120) in each of the separation strips (106) of the first board (100);

b) forming a plurality of conducting tracks (208) on a second substrate board (200), each conducting track (208) being associated with a corresponding contact pad (108) of a component (102) on the first board (100), and each conducting track (208) including a connection strip (209) arranged to coincide with an associated depression (120) on the first substrate board (100), when the first and second substrate boards (100, 200) are assembled;

c) assembling the first and second substrate boards (100, 200) so as to bring the contact pads (108) of the components (102) of the first substrate board (106) into electrical contact with the corresponding tracks (208) on the second substrate board (208), and to make each connection strip (209) on the second board (200) coincide with a corresponding depression (120) on the first substrate board (100); and d) cutting out the first board (100) by forming proximal trenches (130) around the components (102), the proximal trenches opening up into the depressions (120) in the separation strips (106), and cutting out the second board (200) by forming distal trenches (230) further away from the components (102) than the proximal trenches (130) in regions comprising the connection strips, to allow the connection strips (209) on the second board (200) to project at least partially beyond at least one edge of the first board (100), the first and second cut outs being used to individualize modules (300), each module formed of a portion of the first board (100) comprising at least one component (102) and a portion of the second board (200).

2. The method according to claim 1, wherein the cuts in step d) are done by sawing.

3. The method according to claim 2, wherein the cuts in the first and the second substrate boards (100, 200) are made together in a single saw pass with a step-shaped saw blade.

4. The method according to claim 1 wherein a heat sink (140, 240) is fixed on at least one free face of a given module (300), opposite the first face (104) of the first board (100).

5. The method according to claim 1, further comprising a step of connecting the tracks (208) of a given module (300) by metallic wires (250) to contact pins (310) of a package (302) containing the module.

6. The method according to claim 1, wherein the step of assembling the first and second substrate boards (100, 200) further comprises connecting the contact pads (108) of the first board (100) to the conducting tracks (208) of the second board (200) by balls (404) of meltable material.

7. The method according to claim 6, further comprising placement of a dielectric filling material (215) between the first and second substrate boards (100, 200), the dielectric material surrounding the balls (404) of meltable material.

8. The method according to claim 7, wherein a portion of the tracks (208) is designed to contain the balls (404) in at least one depression (207) of the second board (200), the depression being intended to contain the filling material during assembly.

9. The method according to claim 8, wherein the depression (207) in the second substrate board (200) is provided with an upstand (217) located outside the depression areas (120) of the first substrate board, such that the areas between the upstands (217) and around the depressions (207) of the first and second boards. (100, 200) form a bottleneck.

10. The method according to claim 1, wherein the step of assembling further comprises gluing the contact p ads (108) of the first substrate board (100) onto the conducting tracks (208) of the second substrate board (200) using a conducting glue (402).

11. The method according to claim 10, wherein secondary depressions (220) are formed in the second substrate board (200), prior to the step of assembling, to capture any excess glue during assembly.

12. The method according to claim 1, wherein at least one doped region (252, 254) is formed in the second substrate board (200), the at least one doped region (252, 254) connected to at least one of the conducting tracks (208) on the second board (200) and an associated contact pad (108) on the first substrate board (100).

13. The method according to claim 12, wherein each of the doped regions comprise part of a diode.

* * * * *